United States Patent
Engelen et al.

(10) Patent No.: US 11,073,745 B2
(45) Date of Patent: Jul. 27, 2021

(54) ILLUMINATION MODULE

(71) Applicant: Lumileds LLC, San Jose, CA (US)

(72) Inventors: Rob Engelen, Eindhoven (NL); Emanuel Stassar, Sprang Capelle (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/676,967

(22) Filed: Nov. 7, 2019

(65) Prior Publication Data
US 2020/0142278 A1 May 7, 2020

(30) Foreign Application Priority Data

Nov. 7, 2018 (EP) ..................................... 18204878

(51) Int. Cl.
*G03B 15/03* (2006.01)
*F21V 8/00* (2006.01)
(52) U.S. Cl.
CPC ........... *G03B 15/03* (2013.01); *G02B 6/0018* (2013.01); *G02B 6/0048* (2013.01); *G02B 6/0066* (2013.01)
(58) Field of Classification Search
CPC .... G03B 15/03; G02B 6/0018; G02B 6/0048; G02B 6/0066; G02B 6/0068; G02B 6/0015; G02B 6/0013; G02B 6/0046; G02B 6/0045; G02B 6/002; H01S 5/183; H01S 5/005; H01S 5/02292
See application file for complete search history.

(56) References Cited

U.S. PATENT DOCUMENTS

| | | | | |
|---|---|---|---|---|
| 6,097,549 A | * | 8/2000 | Jenkins ................. | B60Q 1/302 359/726 |
| 7,431,481 B2 | * | 10/2008 | Stefanov ............... | F21S 48/215 362/327 |
| 8,077,305 B2 | * | 12/2011 | Owen ................. | G01N 21/9505 356/237.1 |
| 8,616,746 B2 | * | 12/2013 | Shinohara ............ | G02B 6/0018 362/560 |

(Continued)

FOREIGN PATENT DOCUMENTS

GB 2330425 A1 4/1999

OTHER PUBLICATIONS

International Search Report for PCT International Application No. PCT/EP2019/079481 dated Feb. 27, 2020.

(Continued)

*Primary Examiner* — Bao Q Truong
(74) *Attorney, Agent, or Firm* — Volpe Koenig

(57) ABSTRACT

An illumination module comprises a semiconductor light source and a light guide, which comprises a solid body with essentially parallel entry and exit faces and side faces extending between the entry and exit faces; and wherein the entry face receives light emitted by the semiconductor light source; the exit face is offset from the entry face and the area of the exit face exceeds the area of the entry face; a first side face comprises a uniform plane subtending an angle of inclination to the entry face; a second side face, opposite to the first side face, comprises a plurality of offset sub-faces, each sub-face subtends an angle of inclination relative to the entry face; and the inclined faces are formed so that the direction of light leaving the exit face is essentially the same as the direction of light entering the entry face.

20 Claims, 4 Drawing Sheets

(56) References Cited

U.S. PATENT DOCUMENTS

Figure 1:
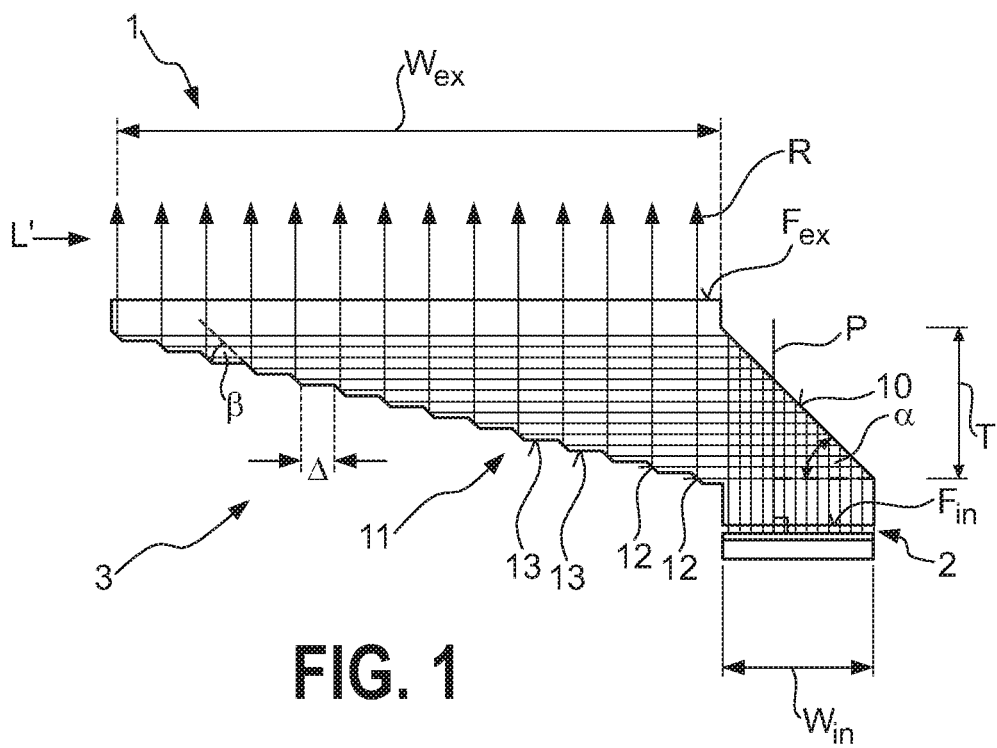

| | | | |
|---|---|---|---|
| 9,733,412 B2* | 8/2017 | Wang | G02B 6/0018 |
| 10,024,521 B2* | 7/2018 | Ebner | G02B 6/00 |
| 2003/0230715 A1 | 12/2003 | Remillard et al. | |
| 2004/0175072 A1 | 9/2004 | Lam et al. | |
| 2016/0320568 A1 | 11/2016 | Haase et al. | |

OTHER PUBLICATIONS

Written Opinion for PCT International Application No. PCT/EP2019/079481 dated May 14, 2020.

* cited by examiner

ILLUMINATION MODULE

FIELD OF INVENTION

The invention describes an illumination module, a hand-held device, and a light guide.

BACKGROUND

Advances in the development of vertical-cavity surface-emitting lasers (VCSELs) have led to VCSEL array dies becoming an interesting alternative to LEDs for various illumination purposes. However, a VCSEL array used as a light source has some disadvantages compared to LEDs. One of the main disadvantages is speckle. A speckle pattern may appear in an image of an object illuminated by a VCSEL array light source, and arises from mutual interference of the wavefronts in the light emitted by the VCSEL array. Wavefronts can cancel each other out, leading to dark spots in the image. Equally, wavefronts can augment each other, leading to bright spots in the image.

There are a number of ways of reducing speckle in images when a VCSEL array is used as a light source. For example, a projection system might include a moving diffusing element between the VCSEL array light source and the projection screen. However, such solutions are not practicable for small devices such as mobile phones, in which the VCSEL array is to be used as a camera flash, flashlight, or iris scanner. Alternatively, a VCSEL array driver may apply modulated current to the VCSEL array. However, this adds to the driver complexity and therefore also to the overall cost of the device. It has also been proposed to manufacture multi-wavelength VCSEL arrays in order to reduce speckle. However, the cost of manufacturing such a VCSEL array is significantly higher compared to the manufacturing costs of a single-wavelength VCSEL array, in which all VCSELs of the array are essentially identical.

A characteristic of a VCSEL light source is its very narrow beam (typically with about 20° FWHM) and its high radiance, where the radiance of a VCSEL may be defined as the radiant flux emitted by the emission surface per unit solid angle per unit projected area. While high radiance is often regarded as a favourable characteristic of a VCSEL, it can be problematic when the VCSELs of a VCSEL array are to be used in an application such as iris scanning or face recognition. Without protective measures in place, the focused beam originating from a high power VCSEL array can cause eye damage, particularly if the emitted light is in the infrared range, which is invisible to the human eye. Another disadvantage associated with using a VCSEL in an imaging application is that the angular range that can be illuminated by a VCSEL beam is significantly smaller that the camera's field of view.

Therefore, it is an object of the invention to provide a safe way of using such a semiconductor light source for various illumination purposes, overcoming the problems outlined above.

US 2004/0175072 discloses an optical assembly incorporating a lens for coupling a beam of light from an optical device to an optical fiber. The lens includes a curved reflecting surface and a focusing surface. The lens is positioned to receive and internally reflect the beam of light from the optical device toward the focusing surface.

SUMMARY

The object of the invention is achieved by the illumination module of claim 1; by the imaging arrangement of claim 12; and by the light guide of claim 13.

According to the invention, the illumination module comprises a semiconductor light source and a light guide, which light guide comprises a solid, preferably transparent body with essentially parallel entry and exit faces and a number of inclined side faces extending between the entry and exit faces. The entry face is arranged to capture essentially all of the light emitted by the semiconductor light source. The exit face is offset from the entry face, and the area of the exit face exceeds the area of the entry face. The light guide is formed so that the direction of light leaving the exit face is essentially the same as the direction of light entering the entry face. The light guide is shaped such that a perpendicular extending from the entry face cannot pass through the exit face, i.e. a light ray leaving the exit face has been re-directed at least once since entering the light guide at the entry face.

Because the light guide acts to spread the light without altering its emission direction, the inventive illumination module is particularly suited for use with a semiconductor light source that comprises VCSELs. For example, the semiconductor light source can comprise a VCSEL array die. Such a VCSEL die can include 50 or more VCSELs arranged in a suitable configuration, for example in a two-dimensional matrix. Preferably, the VCSELs of the array die are top-emitting. Alternatively, instead of using top-emitting laser, a semiconductor light source may be an edge-emitting laser if the attendant speckle effect can be tolerated.

The light guide is preferably made of a material such as poly(methyl methacrylate) (PMMA) or polycarbonate (PC) and may be visualized as a solid block with parallel but offset entry and exit faces. Each side face extends from an edge of the entry face to a corresponding edge of the exit face. Since the area of the exit face exceeds the area of the entry face, it is clear that at least two side faces are inclined, slanting in the same general direction, whereby a second side face is inclined to an overall greater extent than an opposing first side face. These inclined side faces of the light guide are shaped so that—working together—they redirect the light out of the light guide in a specific manner. In the context of the present invention, the term "inclined side face" may be understood to mean that the side face subtends an angle of inclination to the entry face. An inclined side face may be realised as a smooth or uninterrupted surface; may comprise sub-regions that are slanted to a greater or lesser degree than the inclination of that side face; may comprise a number of curved regions, etc. The remaining side faces of the solid body may be assumed to be vertical, and may be assumed to not be involved in redirecting the light. In a preferred embodiment of the invention, the material from which the light guide is made can include a pigment that blocks visible spectrum wavelengths but is transmissive to infrared wavelengths.

While various geometrical shapes are possible, it may be assumed that the entry face and exit face of the light guide are flat and are rectangular in shape, since the emission surface of a semiconductor light source such as a VCSEL or VCSEL array will also generally be square or rectangular in shape. The rectangular entry face will have a smaller area than the rectangular exit face, whereby two opposite edges of the entry face and two corresponding opposite edges of the exit face may be equal in length. With essentially rectangular shapes, it follows that opposite edges of the entry/exit face are parallel.

An advantage of the inventive illumination module is that the light from the semiconductor light source is manipulated in such a way that the radiance of the light is reduced by spreading it over a larger area but without any net change in direction. In this way, a favourable property of the light such as the very small spread in light directions is essentially preserved, while an unfavourable property of the light such as excessive radiance may be reduced (for example by including a suitable diffuser at an appropriate surface of the light guide). With the light guide as described above, the illumination module can be used in an application such as a face recognition module or iris scanner with a VCSEL light source without posing a safety risk. Furthermore, when a VCSEL light source is used, the effect of the light guide is to significantly reduce speckle. This is because the inventive light guide effectively presents a light source with a size that is significantly larger than the size of the actual semiconductor light source. The shape of the light guide results in a significant reduction in the likelihood of wavefronts augmenting each other or cancelling each other out. When used as a light source to illuminate a scene to be imaged by a digital camera, for example, a diffusing structure can be applied to the exit face of the light guide. Together with the larger apparent size of the light source, such a light guide results in smaller speckle features imaged by the camera sensor. The speckle features may be smaller than the size of the sensor pixels and therefore not discernible in the image. The inventive light guide can favourably reduce speckle contrast by more than 50%.

According to the invention, an imaging arrangement comprises a digital camera and an embodiment of the inventive illumination module to illuminate a scene to be imaged by the camera. Because the inventive imaging arrangement can be manufactured in a very compact size, it can be incorporated in a handheld device such as a mobile phone.

According to the invention, the light guide is formed as described above, i.e. as a solid body with essentially parallel entry and exit faces and a plurality of side faces extending between the entry and exit faces; and wherein the entry face is arranged to receive light emitted by a semiconductor light source. The exit face is offset from the entry face and the area of the exit face exceeds the area of the entry face. A first side face comprises a uniform surface subtending an angle of inclination to the entry face, and a second side face, opposite to the first side face, comprises a plurality of offset sub-faces, wherein each sub-face subtends an angle of inclination relative to the entry face. The inclined faces are formed so that the direction of light leaving the exit face is essentially the same as the direction of light entering the entry face.

In a further preferred embodiment of the invention, it may be desirable to broaden the otherwise narrow beam of the VCSEL light source. To this end, the exit face and/or the second side face and/or the entry face can be textured in a suitable manner to achieve a spreading of the VCSEL light beam. For example, a suitable micro lens array can be applied to one or more of those light guide faces.

An advantage of the inventive light guide is that the light exit face is offset from the light entry face, so that the position of the light source as seen by a viewer is offset from the emission surface of the actual light source. When used in a compact device such as a mobile phone, this property may give the designer more options in component placement.

The dependent claims and the following description disclose particularly advantageous embodiments and features of the invention. Features of the embodiments may be combined as appropriate. Features described in the context of one claim category can apply equally to another claim category.

The inventive illumination module can be used in various applications in addition to biometric identification applications such as face recognition or iris scanning mentioned above. For example, the inventive illumination module can be used in applications such as driver monitoring, machine vision, etc.

In the following, but without restricting the invention in any way, it may be assumed that the semiconductor light source is a VCSEL light source, for example a VCSEL array die. The terms "semiconductor light source" and "VCSEL array die" may be used interchangeably in the following. A VCSEL array die may comprise any number of VCSELs, and may be regarded as having a collective emission surface comprising the contributions of the plurality of VCSELs.

When viewed from above, the essentially rectangular shape of the emission surface (of the semiconductor light source) has a width and a height. The inventive light guide acts to "stretch" the light source shape, resulting in a virtual rectangular light source which is offset in position from the actual light source and which has a significantly greater width. As will become clear from the drawings, the extent to which the light source shape is "stretched" or "diluted" will depend on the shapes of the inclined side faces.

Preferably, the dimensions of the light guide are chosen so that the area of the exit face exceeds the area of the entry face by at least 200%, more preferably by at least 1,000%. This is achieved by the significantly greater width of the virtual rectangular light source. The height of the virtual light source may be essentially the same as the height of the emission surface, or may be up to twice as large as the height of the emission surface.

In a preferred embodiment of the invention, a first side face comprises a uniform surface subtending a first angle of inclination to the entry face; and a second side face, opposite to the first side face, comprises a plurality of offset sub-faces or facets, wherein each facet subtends a second angle of inclination relative to the entry face. The first side face has a uniform surface, i.e. the first side face has a smooth or uninterrupted surface. In contrast, the second side face is a "stepped" or faceted side face. Since the purpose of the second face is to direct light outward through the exit face, it may be assumed that the facets of second side face extend along the width of the second side face. Because neighbouring facets are offset from each other, these effectively give the second side face a zig-zag, sawtooth or serrated profile. The sub-faces of the second side face are offset by a small steps that serve to "stretch" the length of the second side face without altering the angle of inclination of the facets. The effect on the light passing through the light guide is to reduce its coherence length. While a long coherence length is generally preferred for a laser light source, this property can undesirable in an application such as iris recognition.

When viewed from the side, light guide has a certain height or thickness. The thickness of the light guide is chosen so that, when viewed from above, the exit face of the light guide does not overlap the entry face of the light guide. Preferably, the dimensions of the light guide are chosen so that, when viewed from above, one short edge of the exit face lies essentially directly above the corresponding edge of the entry face.

To achieve a favourable "spread" in the light leaving the exit face, the second side face preferably has a relatively high density of sub-faces. A minimum offset distance or pitch for n sub-faces can be arrived at by dividing the width of the entry face (i.e. the width of the emission surface) by n−1. For example, if the second side face of the light guide is to comprise 11 sub-faces, a suitable is arrived at by dividing the width of the entry face by 10.

Preferably, the light guide is arranged such that its entry face receives essentially all light originating from the semiconductor light source. Taking various relevant factors such as positioning tolerances, light beam spread etc. into account, the entry face of the light guide should have at least the same size and shape as the emission surface of the VCSEL array die. Preferably, the size of the entry face exceeds the size of the emission surface of the VCSEL array die by a factor of two to ten.

In a particularly preferred embodiment of the invention, the light guide is formed so that the light received from the light source is subject to minimum re-direction before leaving through the exit face. To this end, the angle of inclination of the first side face relative to the entry face is chosen to redirect a light ray towards the second side face. Similarly, the angle of inclination of a sub-face of the second side face is arranged to redirect a light ray out through the exit face. Reflection of a light ray can be specular and can be achieved by coating the relevant face with a reflective material such as a dichroic coating or a thin layer of a suitable metal such as aluminium, silver or gold. However, in a particularly preferred embodiment of the invention, this effect is achieved by choosing an angle of inclination that will result in total internal reflection of the light rays.

If a light ray is not to pass directly through the light guide from entry face to exit face, but is to be reflected off at least one inclined face, it is clear that the minimum number of reflections for that light ray is two. For example, a light ray arrives at the inclined first side face and is reflected a first time. The reflected light ray arrives at an inclined sub-face of the second side face and is reflected again. To ensure that the direction of the light ray leaving the light guide is the same as the direction of that light ray as it entered the light guide, the angle of inclination of the first side face is preferably the same as the angle of inclination of each sub-face of the second side face. Each sub-face of the second side face preferably also subtends the same angle of inclination relative to the entry face.

The desired minimal re-direction of the light rays can be achieved by choosing an angle of inclination for the first side face and/or a sub-face of the second face that will result in total internal reflection of each light ray entering the entry face. Preferably, an angle of inclination is in the range 40°-60°. A favourably straightforward embodiment can be obtained when the angle of inclination of the first side face and each sub-face is 45°.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWING(S)

Figure 2:
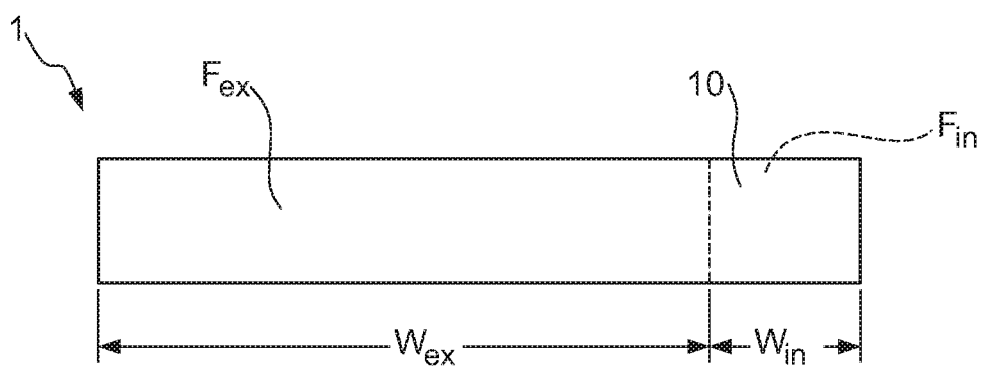
Figure 3:
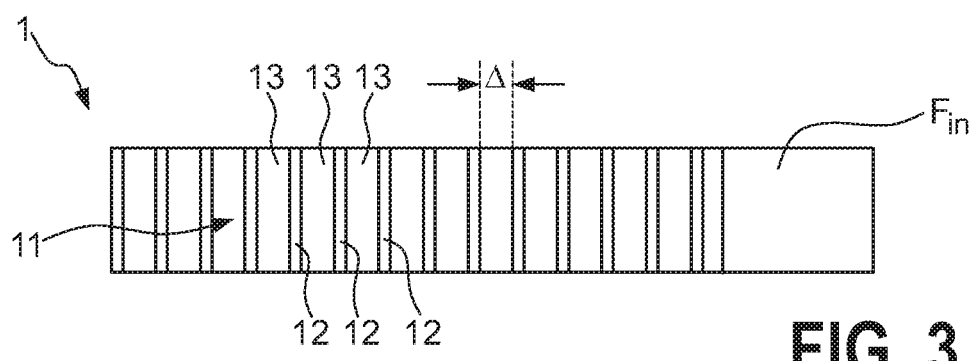
Figure 4:
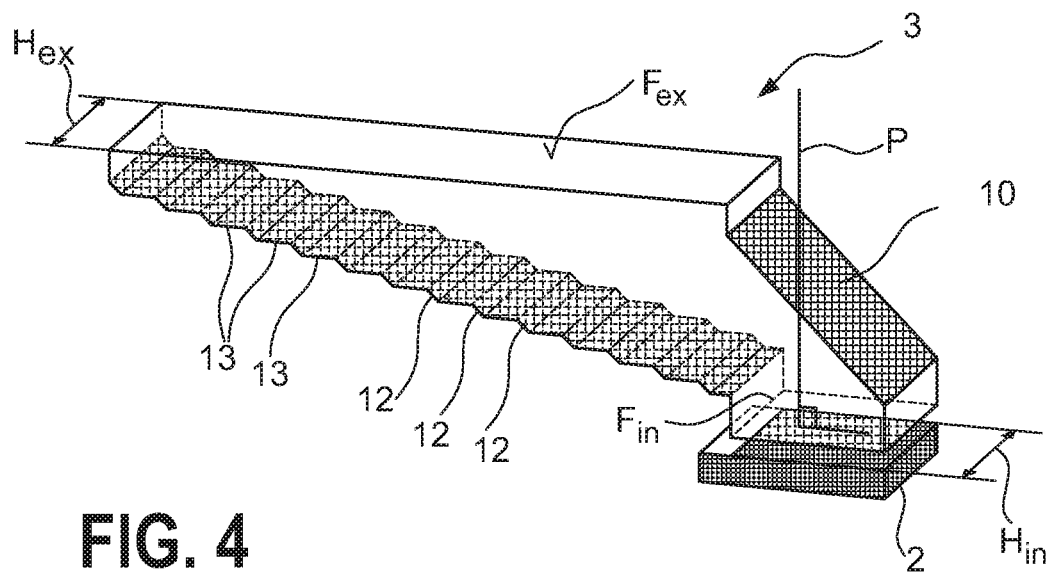
Figure 5:
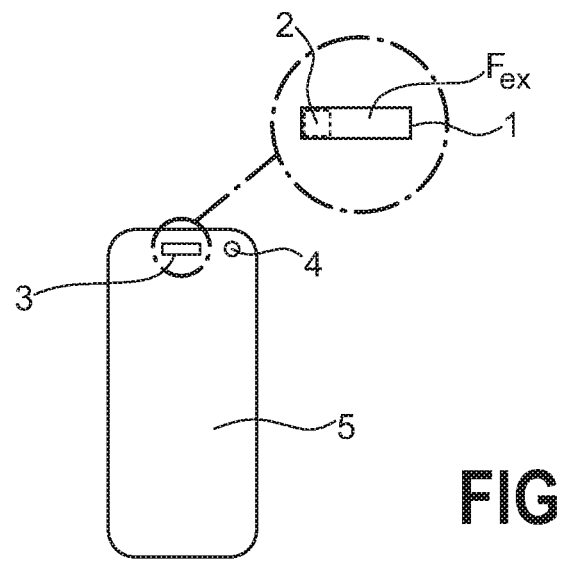
Figure 6:
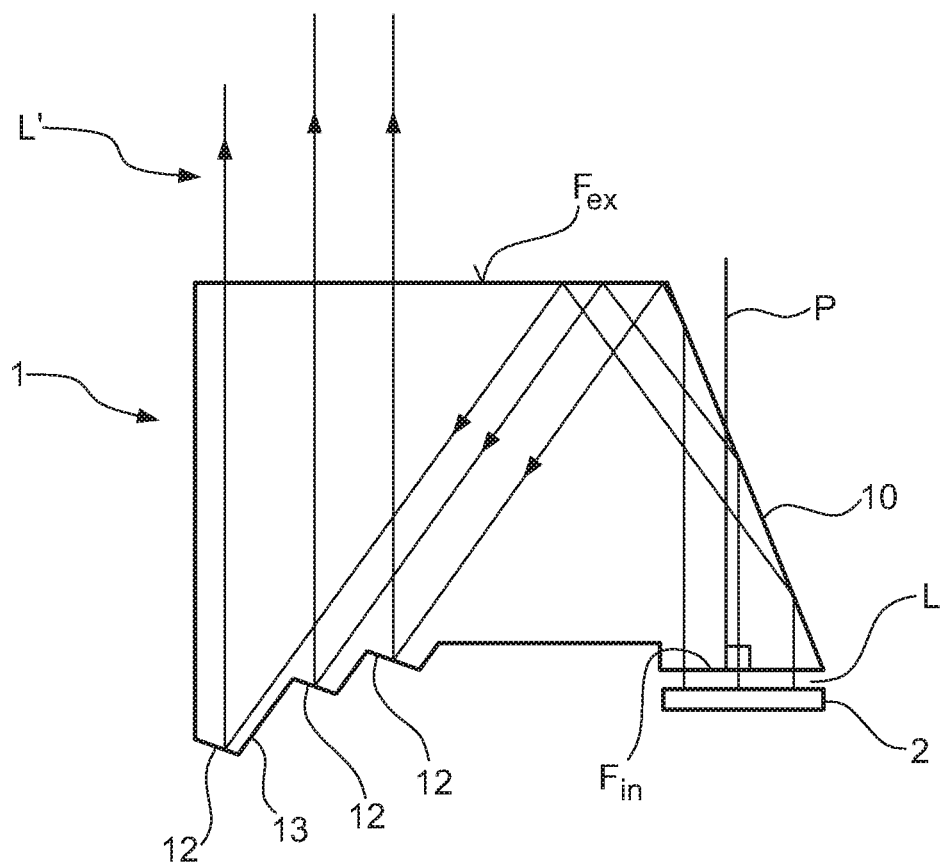
Figure 7:
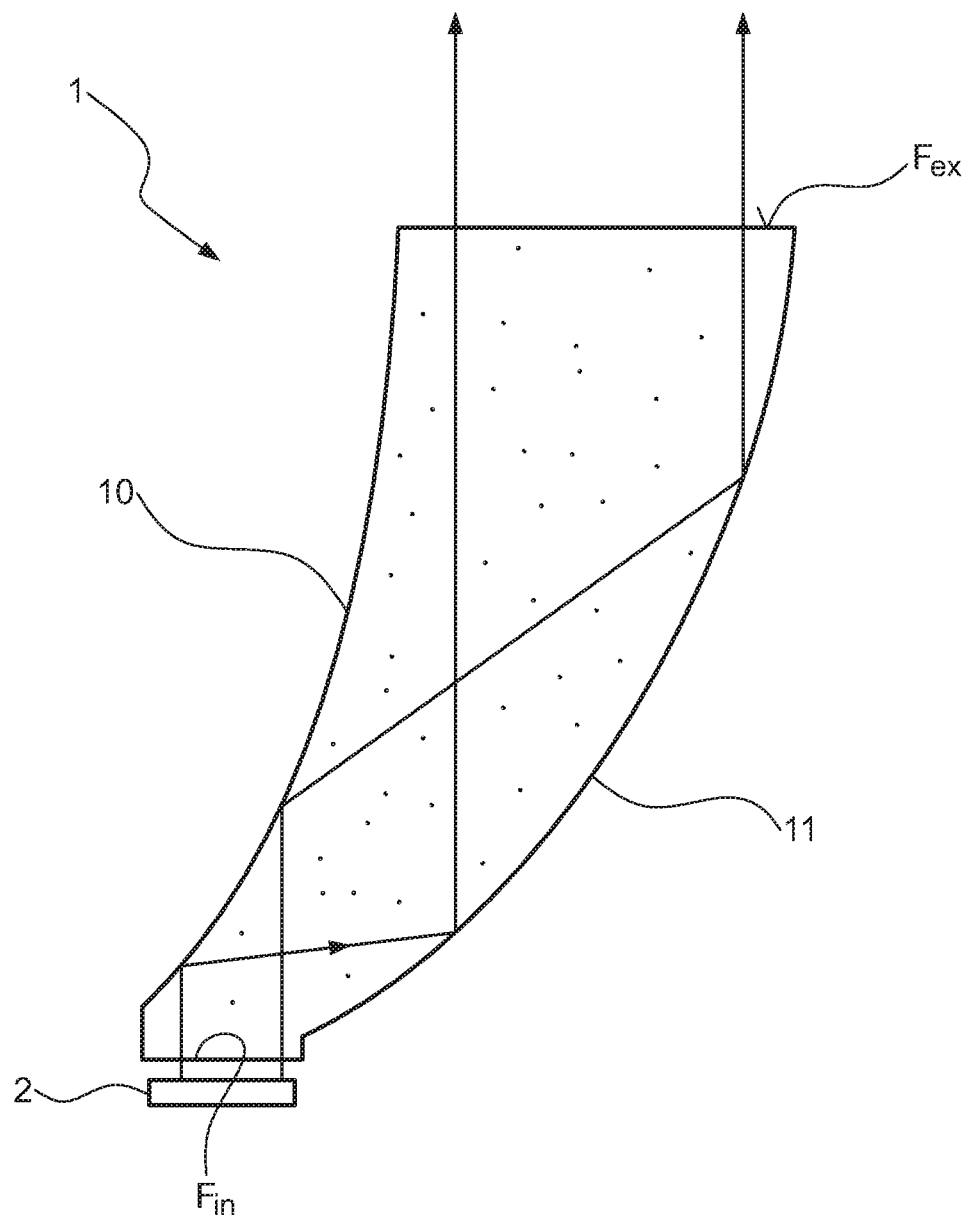

FIG. 1 shows a side view of an embodiment of the inventive light guide;
FIG. 2 shows a plan view of the light guide of FIG. 1 when viewed from above;
FIG. 3 shows a plan view of the light guide of FIG. 1 when viewed from below;
FIG. 4 shows a perspective view of an embodiment of the inventive illumination module;
FIG. 5 shows a handheld device incorporating an embodiment of the inventive illumination module;
FIG. 6 shows an alternative embodiment of the inventive light guide;

FIG. 7 shows an alternative embodiment of the inventive light guide.

In the drawings, like numbers refer to like objects throughout. Objects in the diagrams are not necessarily drawn to scale.

DETAILED DESCRIPTION OF THE PREFERRED EMBODIMENT(S)

FIG. 1 shows a side view of an embodiment of the inventive light guide 1 as used with a VCSEL array die 2 as light source 2 in an illumination module 3. The diagram shows the light guide 1 to have an entry face $F_{in}$ arranged vis-à-vis the light source 2, an exit face $F_{ex}$, and first and second side faces 10, 11 extending between the entry face $F_{in}$ and exit face $F_{ex}$.

The entry face $F_{in}$ is arranged essentially directly above the emission surface of the VCSEL array 2 so that light L leaving the VCSEL array 2 will pass through the entry face $F_{in}$ into the body of the light guide 1. Since a VCSEL emits essentially perpendicularly from its emission surface, all light rays R initially travel directly upwards into the light guide 1 (in reality the light will exhibit a small spread, but for the sake of clarity the diagram shows parallel light rays leaving the emission surface). In this embodiment, the angle of inclination α of the first side face 10 is 45°, so that when a light ray R arrives at the slanted or inclined side face 10, its path undergoes a 90° redirection.

The second face 11 comprises inclined sub-faces 12 offset from each other by offset distances Δ. The length of the offset distance Δ is chosen to obtain a desired width $W_{ex}$ of the exit face $F_{ex}$. For example, the length of the offset distance Δ is chosen to obtain an exit face $W_{ex}$ that is several times as wide as the entry face width $W_{in}$. In this embodiment, the angle of inclination β of each sub-face 12 is also 45°, so that when a light ray R arrives at a slanted or inclined sub-face 12, its path undergoes another 90° re-direction. The light guide 1 is shaped such that a perpendicular P extending from the entry face $F_{in}$ cannot pass through the exit face $F_{ex}$. In other words, it is not possible for any light ray to leave the exit face without being re-directed at least once after entering the light guide at the entry face. The shape of the light guide 1 is such that the light L emitted by the VCSEL array is "diluted" by the time it leaves the exit face $F_{ex}$, but its direction of travel is unchanged. The thickness of the light guide 1 is largely given by the thickness T of the portion defined by the side faces 10, 11 and depends on the chosen angle of inclination α of the first side face 10.

In this exemplary embodiment, the VCSEL array may have an emission surface that measures about 0.5 mm along each side. The entry face may have similar dimensions, so that each edge of the entry face $F_{in}$ has a length of at least 0.5 mm (to ensure that all light is captured). The second face 11 of the light guide 1 can be formed to have 10-15 inclined sub-faces 12 offset by 0.2 mm-0.4 mm, so that the width $W_{ex}$ of the exit face is 3 to 5 times longer than the width $W_{in}$ of the entry face $F_{in}$.

The light guide can be made of a suitable polymer such as PMMA. When the VCSEL array die 2 comprises infrared-emitting VCSELs, the light guide 1 may include a pigment that blocks visible spectrum wavelengths but is transmissive to infrared wavelengths. To improve the safety of the device and to obtain a desired light distribution, a diffusing element may be arranged in the path of the light L' leaving the exit face $F_{ex}$ of the light guide 1. For example, a micro lens array may be arranged over on the exit face $F_{ex}$.

FIG. 2 shows a plan view of the light guide 1 of FIG. 1 when viewed from above. The diagram shows the exit face $F_{ex}$ and the inclined first side face 10, which has a projected area coinciding with the area of the entry face $F_{in}$, so that the exit face $F_{ex}$ appears to lie beside the entry face $F_{in}$.

FIG. 3 shows a plan view of the light guide of FIG. 1 when viewed from below. The diagram shows the entry face $F_{in}$ and the second side face 11, which comprises inclined sub-faces 12 offset from each other by offsets 13. The projected area of the second face 11 coincides with the area of the exit face $F_{ex}$.

FIG. 4 shows a perspective view of an embodiment of the inventive illumination module 3. Here, the inclined sub-faces 12 of the second side 11 can be clearly seen through the transparent body of the light guide 1. The diagram also shows that the horizontal "height" of the exit face $F_{ex}$ of the light guide 1 corresponds to the horizontal "height" of the emission surface of the VCSEL array 2. Only the horizontal width of the light emitted from the emission surface is "stretched" by the light guide 1, and the virtual light source will have the rectangular dimensions of the exit face $F_{ex}$.

FIG. 5 shows a handheld device 5 such as a mobile phone with an imaging arrangement incorporating an embodiment of the inventive illumination module 3. The enlarged portion of the diagram shows the exit face $F_{ex}$ of the light guide 1, and indicates the position of the semiconductor light source 2 underneath the entry face of the light guide 1. The diagram also indicates a camera 4 of the handheld device, which can capture an image of a scene illuminated by the illumination module 3. The handheld device can be manufactured to incorporate such an imaging arrangement at the front and/or rear of the device. An embodiment of the imaging arrangement can be used in an iris scanning application, for example, which can be safely carried out even if the semiconductor light source comprises infrared VCSELs.

FIG. 6 shows a side view of a further embodiment of the inventive light guide 1. Here, the first side face 10 has a steeper angle of inclination, so that the light L entering the light guide 1 undergoes TIR at the first face 10 and then again at the interior of the exit face $F_{ex}$, before reaching the second face 11 and being re-directed by the inclined sub-face 12 to exit the exit face $F_{ex}$. Here also, the light guide 1 is shaped such that a perpendicular P extending from the entry face $F_{in}$ cannot pass through the exit face $F_{ex}$. For use with an infrared light source 2, the light guide can be made of a suitable material that includes a pigment to block visible spectrum wavelengths but which is transmissive to infrared wavelengths.

FIG. 7 shows an alternative embodiment of the inventive light guide 1. Here, the side faces 10, 11 have been formed without facets or sub-faces. Instead, the side faces 10, 11 are curved in such a way that the light is re-directed by TIR through the body of the light guide 1, and such that a perpendicular P extending from the entry face $F_{in}$ cannot pass through the exit face $F_{ex}$. In this case also, the exit face area is significantly larger than the entry face area, resulting in the desired "spread" or "stretching" of the light to reduce the coherence length of the light and/or to reduce speckle contrast in an image when the light source 2 is used to illuminate a scene to be photographed by a digital camera.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

REFERENCE SIGNS light guide 1
side face 10, 11
sub-face 12,
offset distance 13
semiconductor light source 2
illumination module 3
camera 4
handheld device 5
entry face $F_{in}$
exit face $F_{ex}$
light L, L'
light ray R
perpendicular P
thickness T
angle of inclination α, β

What is claimed is:

1. A light guide comprising:
   a solid body comprising:
      an entry face,
      an exit face parallel to the entry face, the exit face having an area that exceeds an area of the entry face,
      a first inclined side face extending from the entry face to the exit face and comprising a uniform plane subtending a first angle of inclination to the entry face, and
      a second inclined side face extending from the entry face to the exit face and comprising a plurality of offset sub-faces, each of the plurality of offset sub-faces subtending a second angle of inclination relative to the entry face.

2. The light guide of claim 1, wherein the solid body is shaped such that a perpendicular extending from the entry face does not pass through the exit face, and a direction of light leaving the exit face is essentially the same as the direction of light entering the entry face.

3. The light guide according to claim 1, wherein the area of the exit face exceeds the area of the entry face by at least 500%.

4. The light guide according to claim 1, wherein the area of the exit face exceeds the area of the entry face by at least 1000%.

5. The light guide according to claim 1, wherein the first angle of inclination is chosen to redirect a light ray toward the second inclined side face.

6. The light guide according to claim 1, wherein the plurality of offset sub-faces comprises at least 5 sub-faces.

7. The light guide according to claim 1, wherein the plurality of offset sub-faces comprises at least 10 sub-faces.

8. The light guide according to claim 1, wherein the second angle of inclination is arranged to redirect a light ray out through the exit face.

9. The light guide according to claim 1, wherein the second angle of inclination is the same for each of the plurality of offset sub-faces.

10. The light guide according to claim 1, wherein the first angle of inclination is the same as the second angle of inclination.

11. The light guide according to claim 1, wherein the first angle of inclination and the second angle of inclination are each between 45° and 60°.

12. The light guide according to claim 1, wherein the entry face and the exit face are rectangular in shape.

13. An illumination system comprising:
a semiconductor light source; and
a light guide comprising a solid body that comprises:
an entry face adjacent the semiconductor light source,
an exit face parallel to the entry face, the exit face having an area that exceeds an area of the entry face,
a first inclined side face extending from the entry face to the exit face and comprising a uniform plane subtending a first angle of inclination to the entry face, and
a second inclined side face extending from the entry face to the exit face and comprising a plurality of offset sub-faces, each of the plurality of offset sub-faces subtending a second angle of inclination relative to the entry face.

14. The illumination system according to claim 13, wherein the light guide is arranged such that the entry face receives essentially all light originating from the semiconductor light source.

15. The illumination system according to claim 13, wherein the area of the exit face exceeds the area of the entry face by at least 500%.

16. The illumination system according to claim 13, wherein the first angle of inclination and the second angle of inclination are each between 45° and 60°.

17. The illumination system according to claim 13, wherein the semiconductor light source comprises at least one vertical-cavity surface-emitting laser (VCSEL).

18. An imaging system comprising:
a camera; and
an illumination module, the illumination module comprising:
a semiconductor light source, and
a light guide comprising a solid body that comprises:
an entry face adjacent the semiconductor light source,
an exit face parallel to the entry face, the exit face having an area that exceeds an area of the entry face,
a first inclined side face extending from the entry face to the exit face and comprising a uniform plane subtending a first angle of inclination to the entry face, and
a second inclined side face extending from the entry face to the exit face and comprising a plurality of offset sub-faces, each of the plurality of offset sub-faces subtending a second angle of inclination relative to the entry face.

19. The imaging system according to claim 18, wherein the first angle of inclination and the second angle of inclination are each between 45° and 60°.

20. The imaging system according to claim 18, wherein the semiconductor light source comprises at least one vertical-cavity surface-emitting laser (VCSEL).

* * * * *